(12) United States Patent
Lai et al.

(10) Patent No.: US 6,448,142 B1
(45) Date of Patent: Sep. 10, 2002

(54) METHOD FOR FABRICATING A METAL OXIDE SEMICONDUCTOR TRANSISTOR

(75) Inventors: Han-Chao Lai, Taichung; Hung-Sui Lin, Hsin-Ying; Tao-Cheng Lu, Koashiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/922,255

(22) Filed: Aug. 3, 2001

(30) Foreign Application Priority Data

May 29, 2001 (TW) .......................................... 90112865

(51) Int. Cl.⁷ ........................................... H01L 21/336
(52) U.S. Cl. ...................... 438/303; 438/302; 438/305; 438/306; 438/307; 438/525; 438/230; 438/231; 438/232
(58) Field of Search ................................. 438/302, 303, 438/305, 306, 307, 525, 230, 231, 232

(56) References Cited

U.S. PATENT DOCUMENTS

| | | | | |
|---|---|---|---|---|
| 5,424,571 A | * | 6/1995 | Liou | |
| 5,858,849 A | * | 1/1999 | Chen | |
| 5,882,975 A | * | 3/1999 | Ishikawa | |
| 5,937,325 A | * | 8/1999 | Ishida | |
| 5,953,616 A | * | 9/1999 | Ahn | |
| 6,030,875 A | * | 2/2000 | May et al. | |
| 6,063,679 A | * | 5/2000 | Gardner et al. | |
| 6,200,863 B1 | * | 3/2001 | Xiang et al. | |
| 6,218,250 B1 | * | 4/2001 | Hause et al. | |
| 6,218,251 B1 | * | 4/2001 | Kadosh et al. | |
| 6,225,229 B1 | * | 5/2001 | Huster | |
| 6,268,640 B1 | * | 7/2001 | Park et al. | |
| 6,284,607 B1 | * | 9/2001 | Patelmo et al. | |
| 6,297,111 B1 | * | 10/2001 | Krivokapic | |
| 6,306,710 B1 | * | 10/2001 | Long et al. | |
| 6,319,798 B1 | * | 11/2001 | Yu | |
| 6,323,561 B1 | * | 11/2001 | Gardner et al. | |
| 6,355,543 B1 | * | 3/2002 | Yu | |

FOREIGN PATENT DOCUMENTS

WO          9930361      * 6/1999

* cited by examiner

*Primary Examiner*—Long Pham
(74) *Attorney, Agent, or Firm*—J.C. Patents

(57) ABSTRACT

A fabrication method for a metal oxide semiconductor transistor is described. A source/drain implantation is conducted on a substrate beside the spacer that is on the sidewall of the gate to form a source/drain region in the substrate beside the spacer. A self-aligned silicide layer is further formed on the gate and the source/drain region. A portion of the spacer is removed to form a triangular spacer with a sharp corner, followed by performing a tilt angle implantation on the substrate to form a source/drain extension region in the substrate under the side of the gate and the spacer with the sharp corner. A thermal cycle is further conducted to adjust the junction depth and the dopant profile of the source/drain extension region.

10 Claims, 3 Drawing Sheets

METHOD FOR FABRICATING A METAL OXIDE SEMICONDUCTOR TRANSISTOR

CROSS-REFERENCE TO RELATED APPLICATION

This application claims the priority benefit of Taiwan application serial no. 90112865, filed May 29, 2001.

BACKGROUND OF THE INVENTION

1. Field of Invention

This invention relates to a fabrication method for a semiconductor device. More particularly, the present invention relates to a fabrication method for a metal oxide semiconductor transistor (MOS transistor).

2. Description of Related Art

The development of the Very Large Scale Integration (VLSI) is evolving along the line of a larger wafer size and a smaller line width. This trend of development enhances the function of integrated circuits and reduces the manufacturing cost. As the device dimension reduces for the metal oxide semiconductor transistor of integrated circuits, the channel length diminishes correspondingly to increase the operating speed of the transistor.

As the device dimension is being miniaturized, an overlapping of the depletion layer of the source/drain region and the channel often occurs due to a reduction of the channel length. The shorter the channel length, the overlapping ratio of the source/drain depletion region is higher. As a consequence, the actual channel length is reduced and such a phenomenon is known as the short channel effect (SCE). In order to resolve the above problem, a lightly doped drain (LDD) is formed. However, when the line width is less than 0.25 micron, the depth of LDD has to be further reduced. As a result, the resistance increases and the speed of the device decreases. In order to avoid the aforementioned drawbacks, a source/drain extension region with a higher dopant concentration is formed to replace the lightly doped region. The fabrication of a source/drain extension region is illustrated in FIGS. 1A to 1B.

FIGS. 1A through 1B are schematic, cross-sectional views, illustrating successive steps of fabricating a metal oxide semiconductor transistor according to the prior art.

Referring to FIG. 1A, a gate 102 is formed on a substrate 100. An ion implantation 104 is further conducted on the substrate 100 to form a source/drain extension region 106, wherein the implanted dosage is greater than $10^{15}/cm^2$.

Referring to FIG. 1B, a spacer 108 is then formed on the sidewall of the gate 102, followed by conducting a source/drain implantation process 110 to form a source/drain region 112 in the substrate 100. Subsequent to the implantation process, the silicon wafer is subjected to a thermal process to repair the crystal structure and to drive-in the dopants. The thermal processing, however, would lead to a lateral diffusion of the source/drain extension region 106 and an increase of the junction depth, enhancing the short channel effect.

SUMMARY OF THE INVENTION

The present invention provides a fabrication method for a metal oxide semiconductor transistor, wherein the junction depth and the dopant profile of the source/drain region are controlled to mitigate the short channel effect. The fabrication of the deep sub-micron device is therefore achieved.

The present invention provides a fabrication method for a metal oxide semiconductor transistor, wherein a source/drain implantation is conducted on a substrate that already comprises a gate having a spacer on the sidewall of the gate to form a source/drain region in the substrate beside the spacer of the gate. Self-aligned silicide is further formed on the surface of the gate and source/drain region. A portion of the spacer is then removed to form a spacer with a triangular cross section. A tilt angle implantation is conducted on the substrate to form a source/drain extension region in the substrate under the spacer and the side of the gate. A thermal cycle process is conducted to adjust the junction depth and dopant profile of the source/drain extension region.

The present invention provides a spacer with a sharp corner to reduce the rat depth of the implanted ions in order to form a shallower source/drain extension region in the substrate under the spacer and the side of the gate. A thermal cycle process is further performed to provide a more accurate adjustment of the junction depth and the dopant profile of the source/drain extension region. The short channel effect due to a reduction of the device dimension is thereby prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2D are schematic, cross-sectional views, illustrating successive steps of fabricating a metal oxide semiconductor transistor according to a preferred embodiment of the present invention.

Figure 1A:
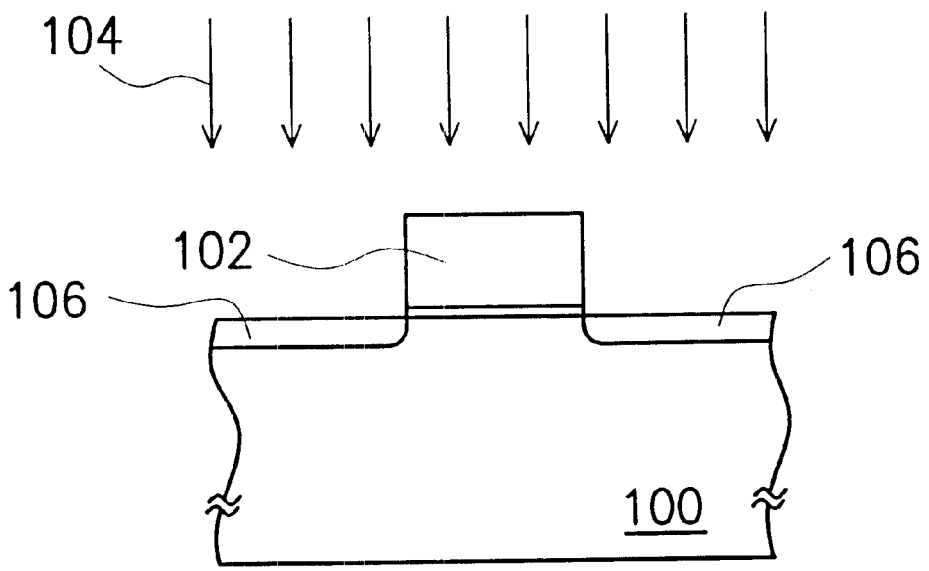
FIGS. 1A through 1B are schematic, cross-sectional views, illustrating successive steps of fabricating a metal oxide semiconductor transistor according to the prior art.
Figure 1B:
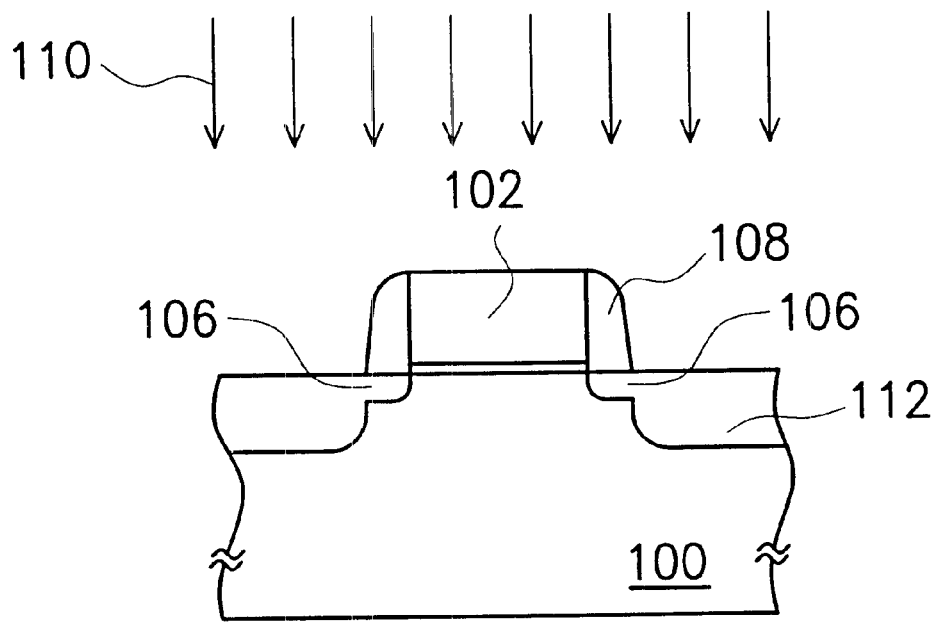
Figure 2A:
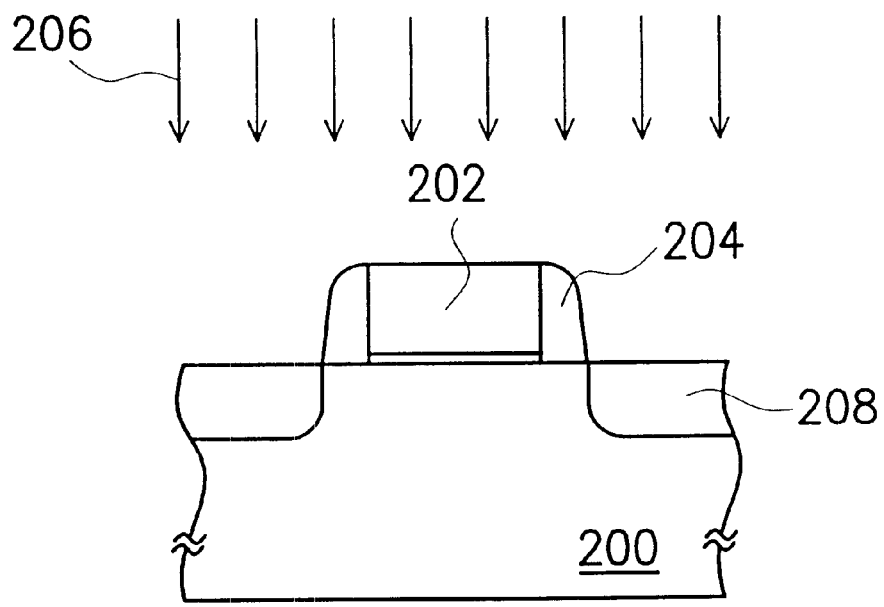
FIGS. 2A through 2D are schematic, cross-sectional views, illustrating successive steps of fabricating a metal oxide semiconductor transistor according to a preferred embodiment of the present invention.

As shown in FIG. 2A, a substrate 200 is provided, wherein a gate 202 is already formed thereon. A spacer 204 is formed on the sidewall of the gate 202, wherein the spacer 204 is formed with, for example, silicon nitride. The spacer 204 is formed by, for example, forming a silicon nitride layer on the substrate 200, followed by performing an anisotropic etching on the silicon nitride layer. A source/drain implantation 206 is further conducted on the substrate 200 to form a source/drain region 208 in the substrate 200 beside the side of the spacer 204.

Figure 2B:
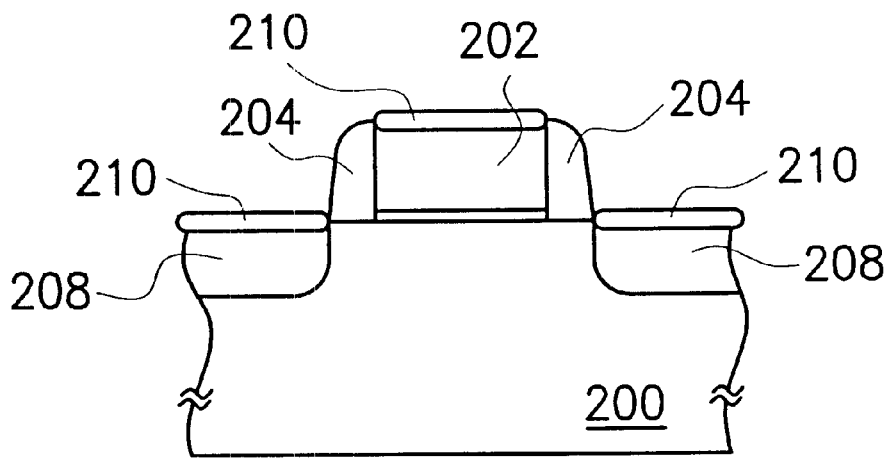

Referring to FIG. 2B, a self-aligned silicide layer 210 is then formed on the exposed surfaces of the gate 202 and the source/drain region 208. The self-aligned silicide layer 210 is formed by, for example, forming a metal layer, such as, titanium on the substrate 200 covering the gate 202. A thermal treatment process is conducted, allowing the silicon gate 202 and the source/drain region 208 to react with the metal layer to form the self-aligned silicide layer 210. The excess unreacted metal layer is removed.

Figure 2C:
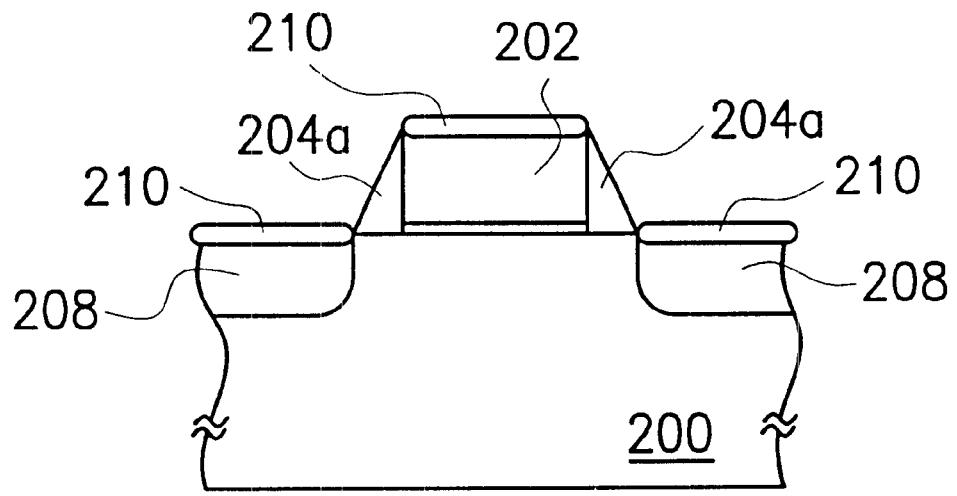

Continuing to FIG. 2C, anisotropic etching is further performed to remove a portion of the spacer 204, forming a spacer 204a having basically a triangular shape cross-section, wherein the top of the spacer 204a has a sharp corner.

Figure 2D:
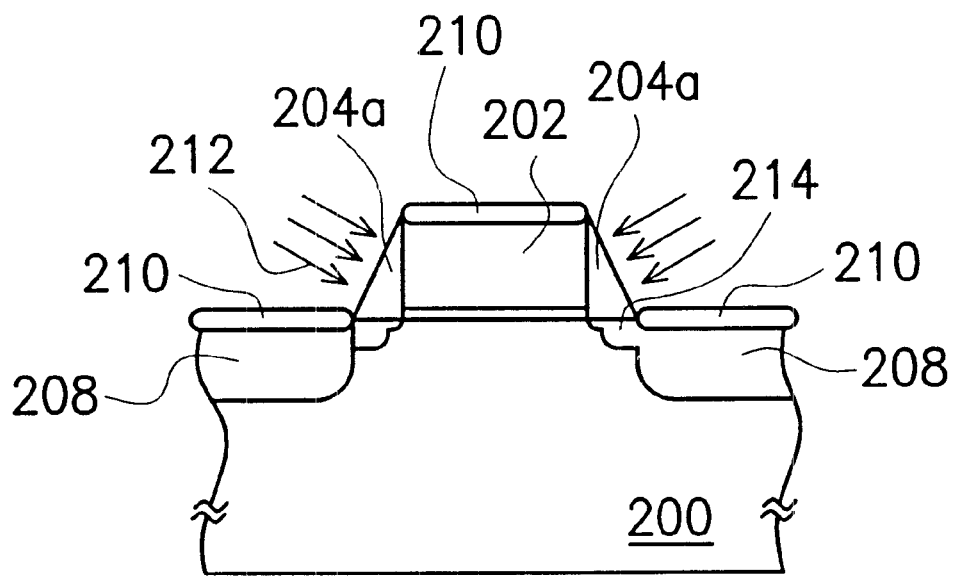

As shown in FIG. 2D, a tilt angle implantation 212 is performed to form a source/drain extension region 214 in the substrate 200 under the spacer 204a and the side of the gate 202. A thermal cycle process is further conducted to adjust the junction depth and dopant profile of the source/drain extension region 214.

According to the present invention, the spacer with a sharp corner reduces the depth of the implanted ions. Moreover, by controlling the implanting conditions of the tilt angle implantation process, a shallower source/drain extension region is formed in the substrate under the spacer and the side of the gate. Laterial diffusion of the source/drain extension region is thus mitigated and the junction depth is prevented from being increased during the thermal process. The short channel effect is thereby suppressed. According to the present invention, a thermal cycle process is also performed to provide a more accurate adjustment of the junction depth and the dopant profile of the source/drain extension region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal oxide semiconductor transistor, comprising:

providing a substrate having a gate formed thereon, wherein a spacer is already formed on a sidewall of the gate;

forming a source/drain region in the substrate beside a sidewall of the gate;

forming a plurality of self-aligned metal silicide layers on exposed surfaces of the gate and the source/drain region;

removing a portion of the spacer to form a spacer having a sharp corner; and performing a tilt angle implantation on the substrate to form a source/drain extension region in the substrate beside a side of the gate and under the spacer with the sharp corner.

2. The method of claim 1, wherein the spacer with the sharp corner has basically a triangular shape cross-section.

3. The method of claim 1, wherein after forming the source/drain extension region, a thermal cycle process is further conducted to adjust a junction depth and a dopant profile of the source/drain extension region.

4. The method of claim 1, wherein the spacer is formed with silicon nitride.

5. The method of claim 1, wherein forming the self-aligned suicide layers further includes:

forming a metal layer on the substrate to cover the gate;

conducting a thermal treatment process to allow the metal layer to react with the gate and the source/drain region to form the self-aligned silicide layers; and removing an excess metal layer.

6. The method of claim 5, wherein the metal layer includes titanium.

7. A fabrication method for a metal oxide semiconductor transistor, comprising providing a substrate, wherein a gate is already formed thereon;

forming a spacer on a sidewall of the gate;

forming a source/drain region in the substrate beside the spacer;

removing a portion of the spacer to form a spacer with a sharp corner; and performing a tilt angle ion implantation to form a source/drain extended region in the substrate beside a side of the gate and under the spacer with the sharp corner.

8. The method of claim 7, wherein the spacer with the sharp corner has basically a triangular cross-section.

9. The method of claim 7, wherein after forming the source/drain extension region, a thermal cycle process is further conducted to adjust a junction depth and a dopant profile of the source/drain extension region.

10. The method of claim 7, wherein the spacer is formed with silicon nitride.

* * * * *